United States Patent
Ghosh et al.

(10) Patent No.: US 8,421,510 B2
(45) Date of Patent: Apr. 16, 2013

(54) LOW VOLTAGE HIGH-SPEED WAVE SHAPING CIRCUITRY

(75) Inventors: Diptendu Ghosh, Dallas, TX (US); Rajarshi Mukhopadhyay, Allen, TX (US); Reza Sharifi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 168 days.

(21) Appl. No.: 13/100,819

(22) Filed: May 4, 2011

(65) Prior Publication Data

US 2011/0304373 A1    Dec. 15, 2011

Related U.S. Application Data

(60) Provisional application No. 61/355,047, filed on Jun. 15, 2010.

(51) Int. Cl.
*H03K 3/017* (2006.01)
*H03K 5/04* (2006.01)
*H03K 7/08* (2006.01)

(52) U.S. Cl.
USPC .................................. 327/172; 327/173

(58) Field of Classification Search .............. 327/108, 327/172–177, 530–550
See application file for complete search history.

(56) References Cited

U.S. PATENT DOCUMENTS

| 6,614,291 B1 * | 9/2003 | Zhao et al. ............... 327/408 |
| 7,786,754 B2 | 8/2010 | Contreras et al. |
| 7,812,643 B2 * | 10/2010 | Govindu et al. ............ 326/115 |
| 2010/0246048 A1 | 9/2010 | Ranmuthu |
| 2011/0148540 A1 * | 6/2011 | Nakano .................. 331/186 |

FOREIGN PATENT DOCUMENTS

EP    0980065    2/2000

* cited by examiner

*Primary Examiner* — Lincoln Donovan
*Assistant Examiner* — Diana J Cheng
(74) *Attorney, Agent, or Firm* — Alan A. R. Cooper; Wade J. Brady, III; Frederick J. Telecky, Jr.

(57) ABSTRACT

Within hard disk drives (HDDs), for example, a preamplifier or preamp is generally used to perform read and write operations with a magnetic head. Typically, for write operations, the preamplifier generates a current waveform that uses a DC current to polarize magnetic elements within the disk and overshoot components to compensate for frequency dependent attenuation in the interconnect between the head and preamp. Conventional pulse-shaping circuitry used for this application uses high voltage to accomplish this task. Here, however, pulse-shaping circuitry is provided which can generate a similar waveform using lower voltage (i.e., about 5V) for this application and others.

20 Claims, 11 Drawing Sheets

US 8,421,510 B2

LOW VOLTAGE HIGH-SPEED WAVE SHAPING CIRCUITRY

CROSS-REFERENCE TO RELATED APPLICATIONS

This application claims priority to U.S. Patent Appl. Ser. No. 61/355,047, entitled "LOW VOLTAGE HIGH-SPEED DESIGN TECHNIQUE FOR HARD DISK DRIVER WRITERS," filed on Jun. 15, 2010, which is hereby incorporated by reference for all purposes.

TECHNICAL FIELD

The invention relates generally to pulse shaping and, more particularly, to pulse shaping using a low voltage.

BACKGROUND

Within hard disk drives (HDDs), a preamplifier or preamp is generally used to perform read and write operations with a magnetic head. Typically, for write operations, the preamplifier generates a current waveform that uses a DC current to polarize magnetic elements within the disk and overshoot components to compensate for frequency dependant attenuation in the interconnect between the head and preamp. Turning to FIGS. 1 and 2, an example of a conventional preamp 100 and its general operation for a write operation can be seen. Initially, a differential write signal WDX and WDY is applied to the input buffer 102, which is transferred to the duration generator 104. From this differential write signal WDX and WDY, the duration generator 104 produces differential signal NDLYX and NDLYY and a delayed differential signal DLYX and DLYY, which are provided to the pulse-shaping circuitry 108 through the signal buffers 106 within the writer head 105. The pulse-shaping circuitry 108 then produces DC current signals IDCX and IDCY and boost current signals IBSTX and IBSTY, which are used by the H-bridge 110 to generate the writer current waveform for the magnetic head or write signal WRITE.

For conventional preamps (such as preamp 100), a high voltage supply of about 8V or 10V is used to generate this writer current waveform, and, as shown in FIG. 3, this high voltage was usually applied in the pulse-shaping circuitry 108. Typically, the pulse-shaping circuitry 108 includes positive and negative portions, which respectively have a pulse generator 201-1 or 201-2, a current-to-voltage (I-V) converter 202-1 or 202-2, and amplifier 206-1 or 206-2. This pulse-shaping circuitry 108 generates the positive and negative portions boost current signals IBSTX-P/IBSTY-P and IBSTX-M/IBSTY-M. For the sake of simplicity, pulse generator 201-1, I-V converter 202-1, and amplifier 206-1 are described below, but the same description can apply to pulse generator 201-2, I-V converter 202-2, and amplifier 206-2.

Looking first to the pulse generator 201-1 (an example of which is shown in detail in FIG. 4), current commutators are stacked in a NAND-like fashion. Namely, there are three sets of differential pairs (i.e., transistors Q1 through Q6) that are driven by signals NDLYX, NDLYY, DLYX, and DLYY such that a current pulses are generated for signals IX-P and IY-P, respectively, during the internals when signs NDLYX and DLYY are logic high or "1" and when signs NDLYY and DLYX are logic high or "1." This results in a voltage drop of $2V_{CE}$ since at least two of transistors Q1 through Q6 (which are NPN transistors) are within each current or signal path. Also, because there is also a bias transistor Q7 (which receives a bias voltage BIAS) coupled within each current path, there is an additional voltage drop $V_{CE}$, meaning that the topology would need headroom for $3V_{CE}$ (plus the voltage drop across resistor R1) or approximately 3V.

Typically, these currents IX-P and IY-P are then converted to voltages with I-V converter 202-1 and converted into boost current signals IBSTX-P and IBSTY-P by amplifier 206-1. Each of the I-V converter 202-1 and amplifier 206-1 generally includes two sections or portions: one for current IX-P and one for IY-P. As shown in FIG. 5, each portion of the I-V converter 202-1 is generally comprised of a "diode stack" and resistor, and each portion of the amplifier 206-1 is generally a two stage class AB amplifier (which generally includes transistors Q7-Q9 and resistor R3. The first stage of each portion of the amplifier 206-1 (which generally includes a push-pull amplifier having transistors Q7 and Q8) increases the current from 1 to α. The resistor and diodes in the corresponding portion of I-V converter 202-1 provides a voltage drop of $2V_{CE}$ plus a voltage drop across the resistor, resulting in the need for additional headroom for $2V_{CE}$ plus a resistor voltage drop (totaling about 6V across the pulse generator 201-1 and the I-V converter 202-1). This would mean that the total supply voltage would be greater than 6V, and for this example, supply rail VCC would be 5V and supply rail VEE would be −3V. The second stage of each portion of amplifier 206-1 (which generally includes common emitter amplifier having transistor Q9 and resistor R3) increases the current from α to $α^2$ to generate boost current signals IBSTX-P or IBSTY-P.

A drawback from this arrangement, however, is that it uses high power (i.e., 8V) due in part the voltage drop of $5V_{CE}$ plus a resistor voltage drop in the pulse-shaping circuitry 108. Therefore, there is a need for pulse-shaping circuitry that can operate at lower voltages.

Some other conventional circuits are: U.S. Pat. No. 7,786, 754; U.S. Patent Pre-Grant Publ. No. 2010/0246048; and European Patent No. EP0980065.

SUMMARY

A preferred embodiment of the present invention, accordingly, provides an apparatus. The apparatus comprises a pulse generator having: a first differential pair of transistors that receives a first differential input signal and that outputs a first current signal; a first bias transistor that is coupled to each transistor from the first differential pair at a first node; a second differential pair of transistors that receives the first differential input signal and that outputs a second current signal; a second bias transistor that is coupled to each transistor from the second differential pair at a second node; a third differential pair of transistors that receives a second differential input signal, wherein a first transistor from the third differential pair is coupled to the first node, and wherein a second transistor from the third differential pair is coupled to the second node; a current-to-voltage (I-V) converter that is coupled to each of the first and second differential pairs so as to receive the first and second current signals; and an amplifier that is coupled to the I-V converter that generates a first output signal in response to the first current signal and a second output signal in response to the second current signal.

In accordance with an embodiment of the present invention, the first differential input signal further comprises a write data input signal, and wherein the second differential input signal further comprises a delayed write data input signal.

In accordance with an embodiment of the present invention, the first current signal further comprises a first current pulse in response to a first edge of the write data input signal, and wherein the second current signal further comprises a second current pulse in response to a second edge of the write data input signal.

In accordance with an embodiment of the present invention, the first edge further comprises a rising edge, and wherein the second edge further comprises a falling edge.

In accordance with an embodiment of the present invention, the I-V converter further comprises a first portion and a second portion, and wherein each of the first and second portions of the I-V converter further comprises: a first diode that is coupled to the pulse generator; a second diode that is coupled to the first diode; and a resistor that is coupled to the second diode.

In accordance with an embodiment of the present invention, the amplifier further comprises a first portion that is coupled to the first portion of the I-V converter and a second portion that is coupled to the second portion of the I-V converter, and wherein each of the first and second portions of the amplifier further comprise: a push-pull amplifier coupled across its first and second diodes; a intermediate stage that is coupled to the push-pull amplifier, wherein the intermediate stage includes a current mirror; and a common emitter amplifier that is coupled to the current mirror of the intermediate stage.

In accordance with an embodiment of the present invention, the push pull amplifier further comprises: a first bipolar transistor that is coupled to the first diode at its base; and a second bipolar transistor that is coupled to the second diode at its base and the emitter of the first bipolar transistor at its emitter.

In accordance with an embodiment of the present invention, the intermediate stage further comprises: a third bipolar transistor that is coupled to collector of the first bipolar transistor at its collector and base; a fourth bipolar transistor that is coupled to the base of the third bipolar transistor; and a fifth bipolar transistor that is coupled to the emitter of the first bipolar transistor at its emitter and the second diode at its base.

In accordance with an embodiment of the present invention, an apparatus is provided. The apparatus comprises a signal buffer that is configured to provide write data input signal and a delayed write data input signal; pulse-shaping circuitry having: first and second pulse generators that each include: a first differential pair of transistors that receives the write data input signal and that outputs a first current signal; a first bias transistor that is coupled to each transistor from the first differential pair at a first node; a second differential pair of transistors that receives the write data input signal and that outputs a second current signal; a second bias transistor that is coupled to each transistor from the second differential pair at a second node; a third differential pair of transistors that receives the delayed write data input signal, wherein a first transistor from the third differential pair is coupled to the first node, and wherein a second transistor from the third differential pair is coupled to the second node; first and second I-V converters, wherein the first I-V converter is coupled to each of the first and second differential pairs from the first pulse generator, and wherein the second I-V converter is coupled to each of the first and second differential pairs from the second pulse generator; and first and second amplifiers, wherein the first amplifier is coupled to the first I-V converter, and wherein the second amplifier is coupled to the second I-V converter; and an H-bridge that is coupled to the each of the first and second amplifiers.

In accordance with an embodiment of the present invention, the apparatus further comprises: an input buffer that is configured to receive a write signal from a channel; and a duration generator that is coupled between input buffer and the pulse-shaping circuitry.

In accordance with an embodiment of the present invention, the push pull amplifier and the intermediate stage further comprises: a first bipolar transistor that is coupled to the first diode at its base; and a second bipolar transistor that is coupled to the second diode at its base and the emitter of the first bipolar transistor at its emitter; a third bipolar transistor that is coupled to collector of the first bipolar transistor at its collector and base; a fourth bipolar transistor that is coupled to the base of the third bipolar transistor; and a fifth bipolar transistor that is coupled to the emitter of the first bipolar transistor at its emitter and the second diode at its base.

In accordance with an embodiment of the present invention, a method is provided. The method comprises activating a first transistor from a first differential input pair within a pulse generator in response to a first edge from a first portion of the differential input signal while a second transistor from a second differential input pair within the pulse generator is inactive, wherein the first transistor is biased by a first bias transistor that is coupled to a first supply rail; activating the second transistor from the second differential input pair within the pulse generator in response to a second edge from a first portion of the delayed differential input signal; outputting a first current pulse from the first transistor during the interval between the first edge and the second edge; activating a third transistor from a third differential input pair within a pulse generator in response to a third edge from a second portion of the differential input signal while a fourth transistor from the second differential input pair within the pulse generator is inactive, wherein the third transistor is biased by a second bias transistor that is coupled to the first supply rail; activating the fourth transistor from the second differential input pair within the pulse generator in response to a fourth edge from a second portion of the delayed differential input signal; outputting a second current pulse from the third transistor during the interval between the third edge and the fourth edge; converting the first and second current pulses into first and second voltage signals; and generating first and second output current signals from the first and second voltages.

In accordance with an embodiment of the present invention, the first and second portions of the differential input signal further comprise positive and negative portions of the differential input signal, respectively, and wherein the corresponding first and second portions of the delayed differential input signal further comprise negative and positive portions of the delayed differential input signal, respectively.

In accordance with an embodiment of the present invention, the step of amplifying further comprises: applying the first and second voltage signals to first and second push-pull amplifiers, respectively; scaling output currents from each of the first and second push-pull amplifiers up; and generating first and second output current signals.

In accordance with an embodiment of the present invention, the method further comprises applying the first and second output currents to an H-bridge.

In accordance with an embodiment of the present invention, the differential input signal and the delayed differential input signal further comprise a write data input signal and a delayed write data input signal, respectively.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
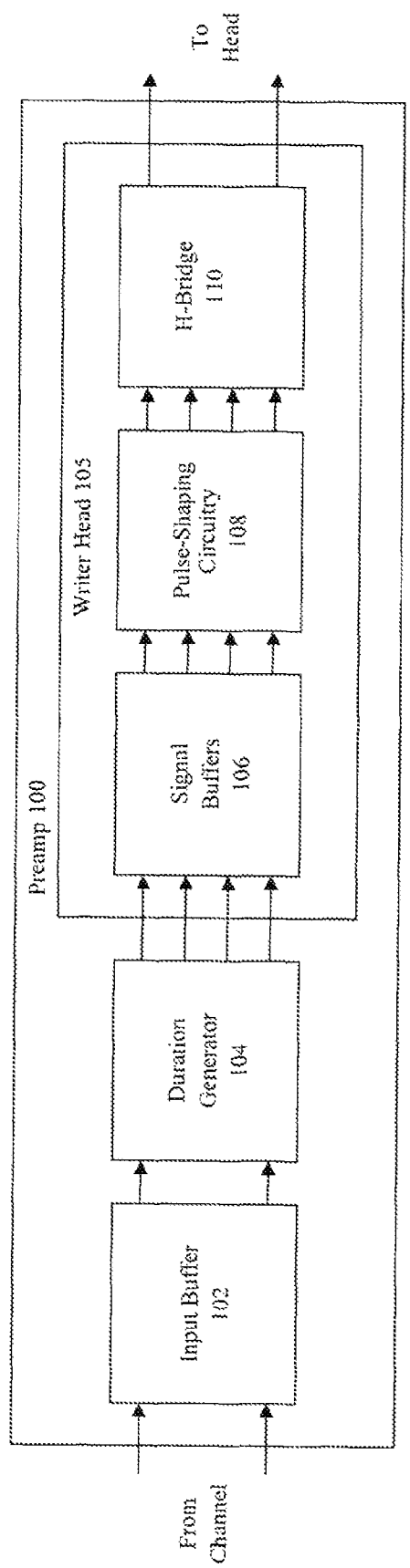
FIG. 1 is a diagram of an example of a conventional preamplifier.
Figure 2:
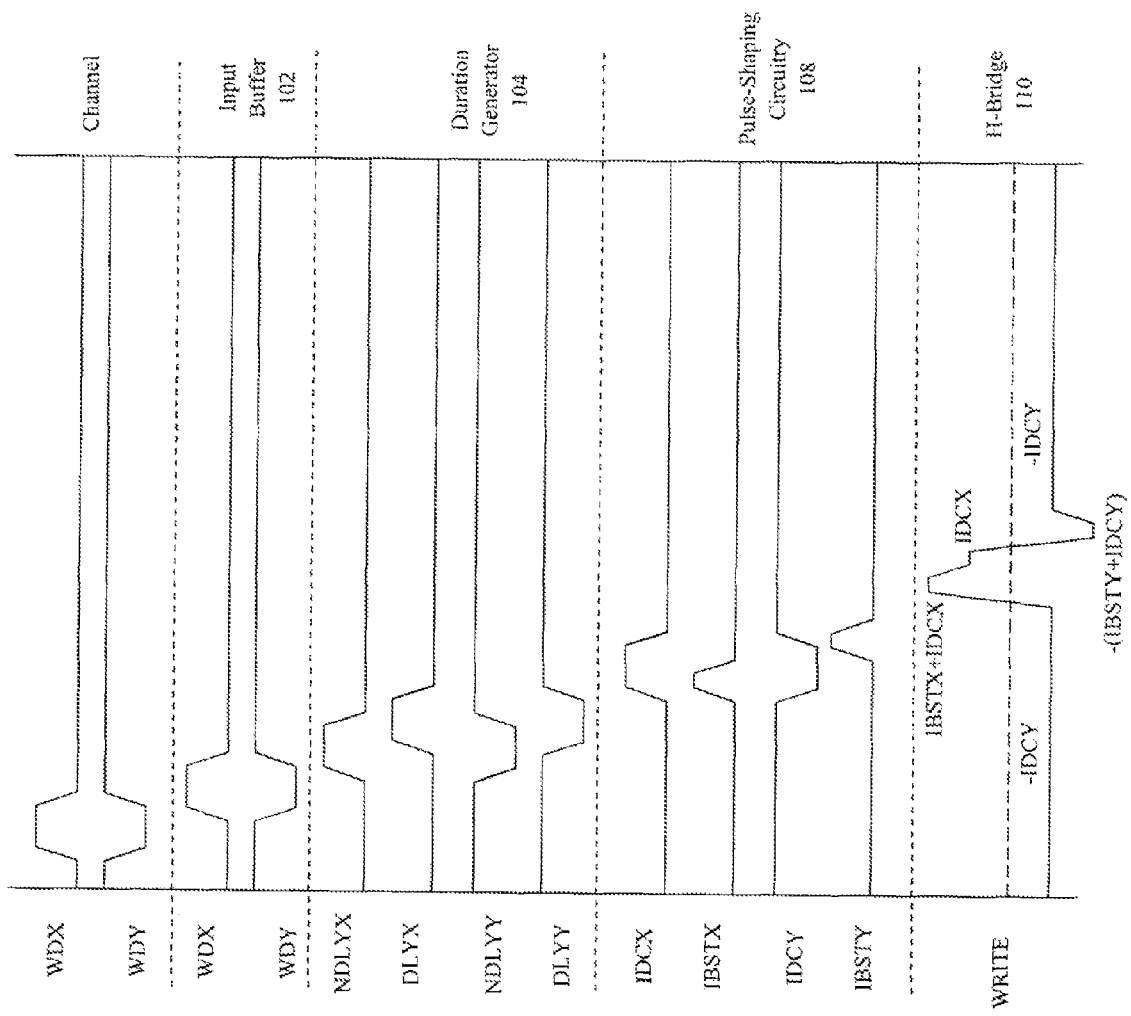
FIG. 2 is a diagram of the waveforms generated by the preamplifier of FIG. 1.
Figure 3:
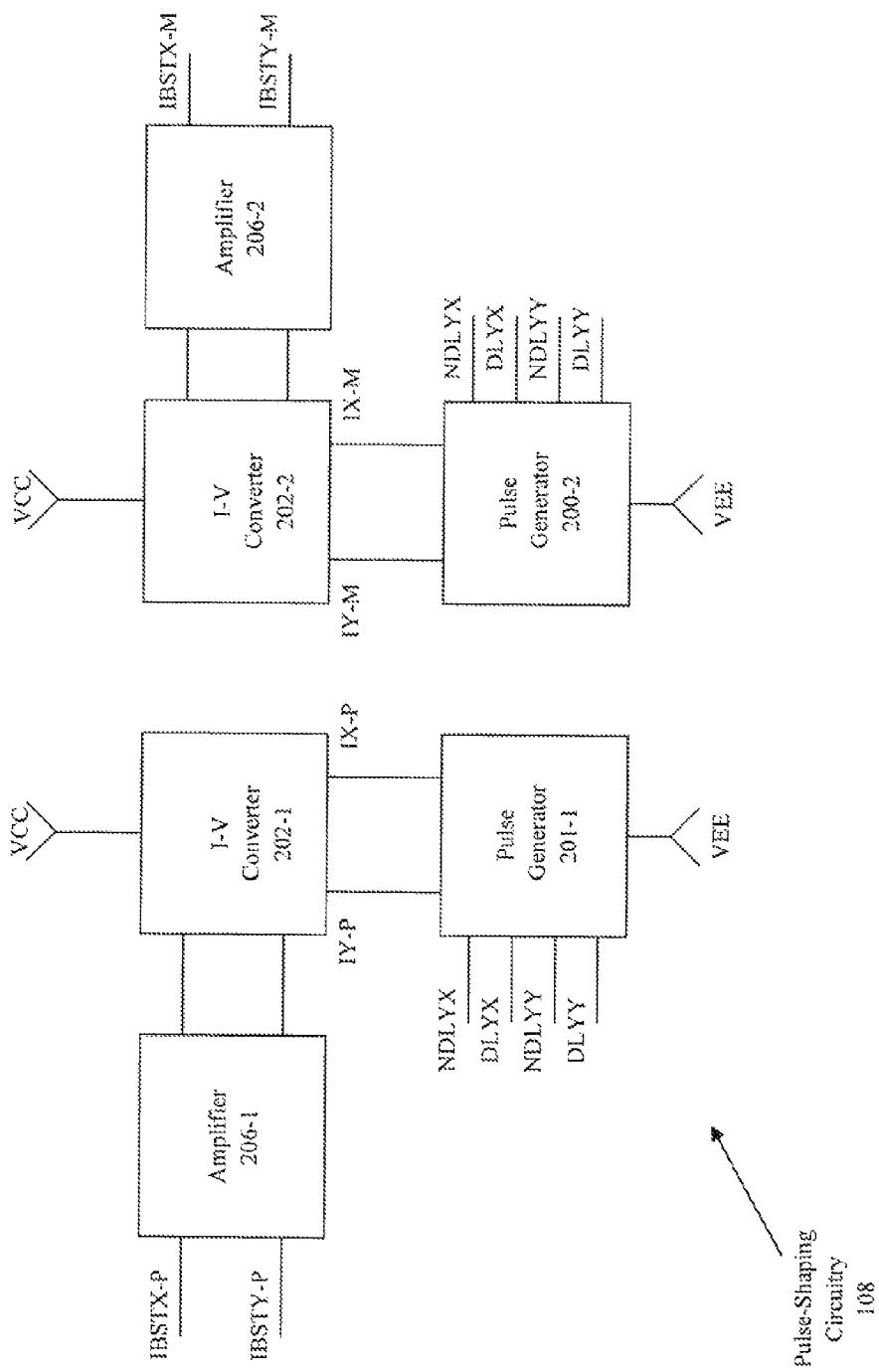
FIGS. 3-5 are diagrams of an example of conventional pulse-shaping circuitry for the preamplifier of FIG. 1.
Figure 4:
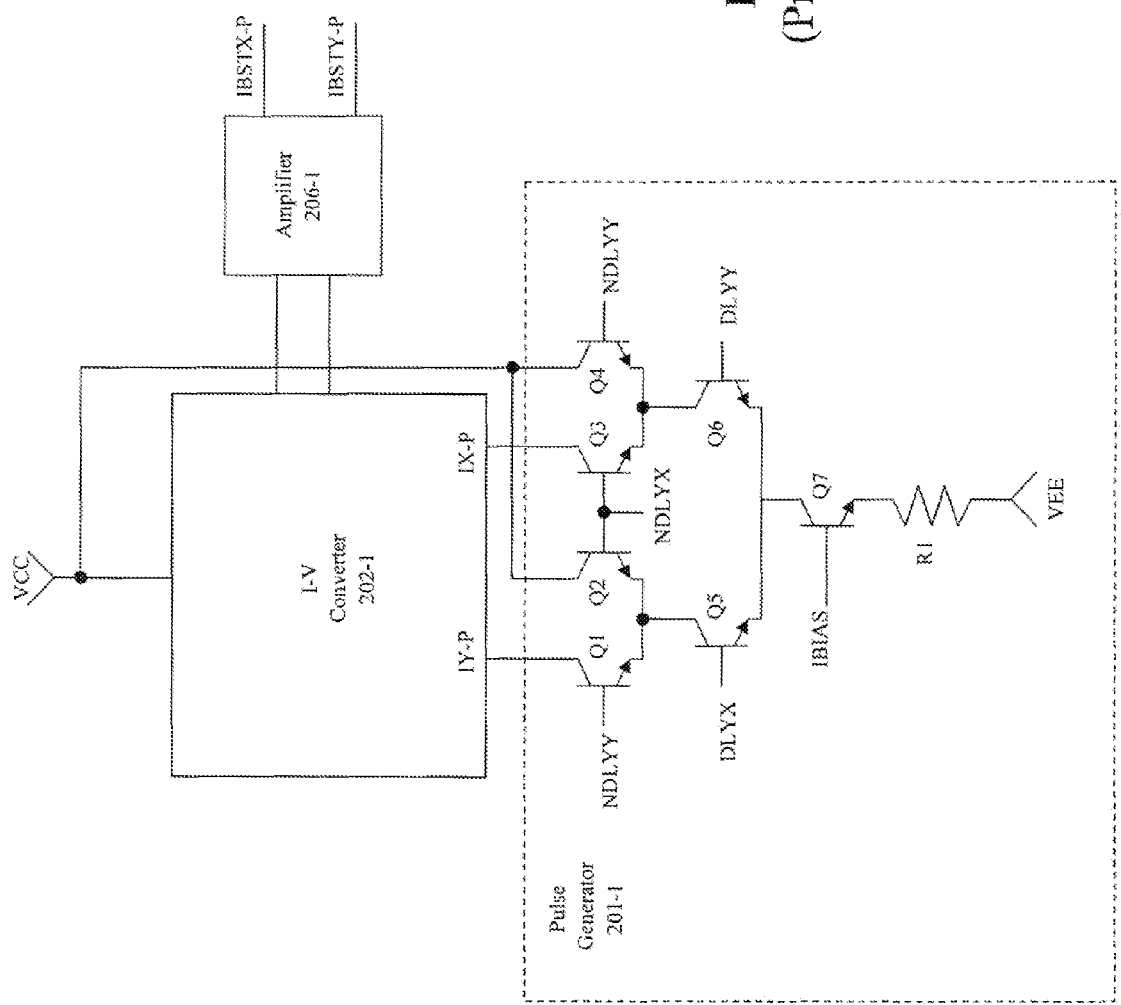
Figure 5:
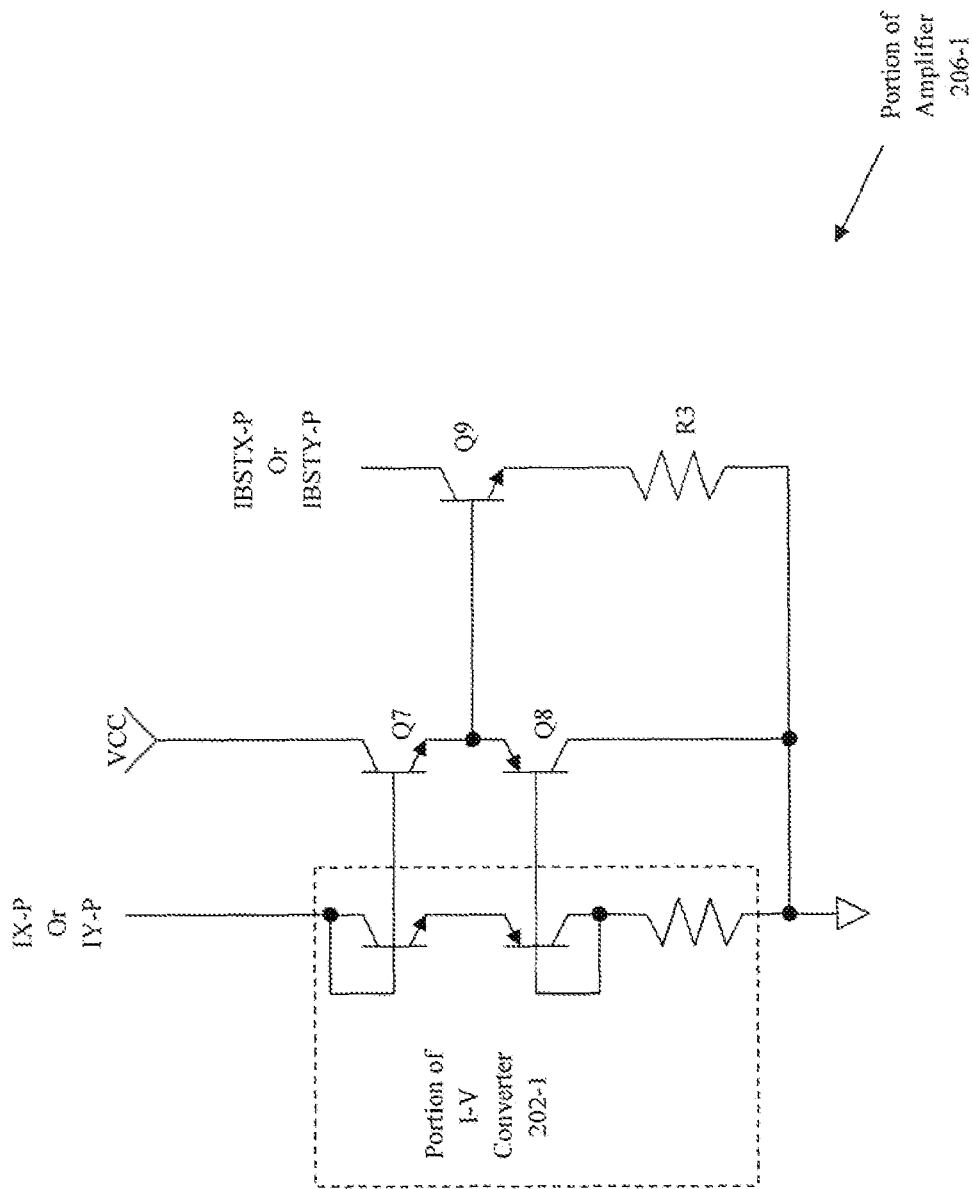

Refer now to the drawings wherein depicted elements are, for the sake of clarity, not necessarily shown to scale and wherein like or similar elements are designated by the same reference numeral through the several views.

Figure 6:
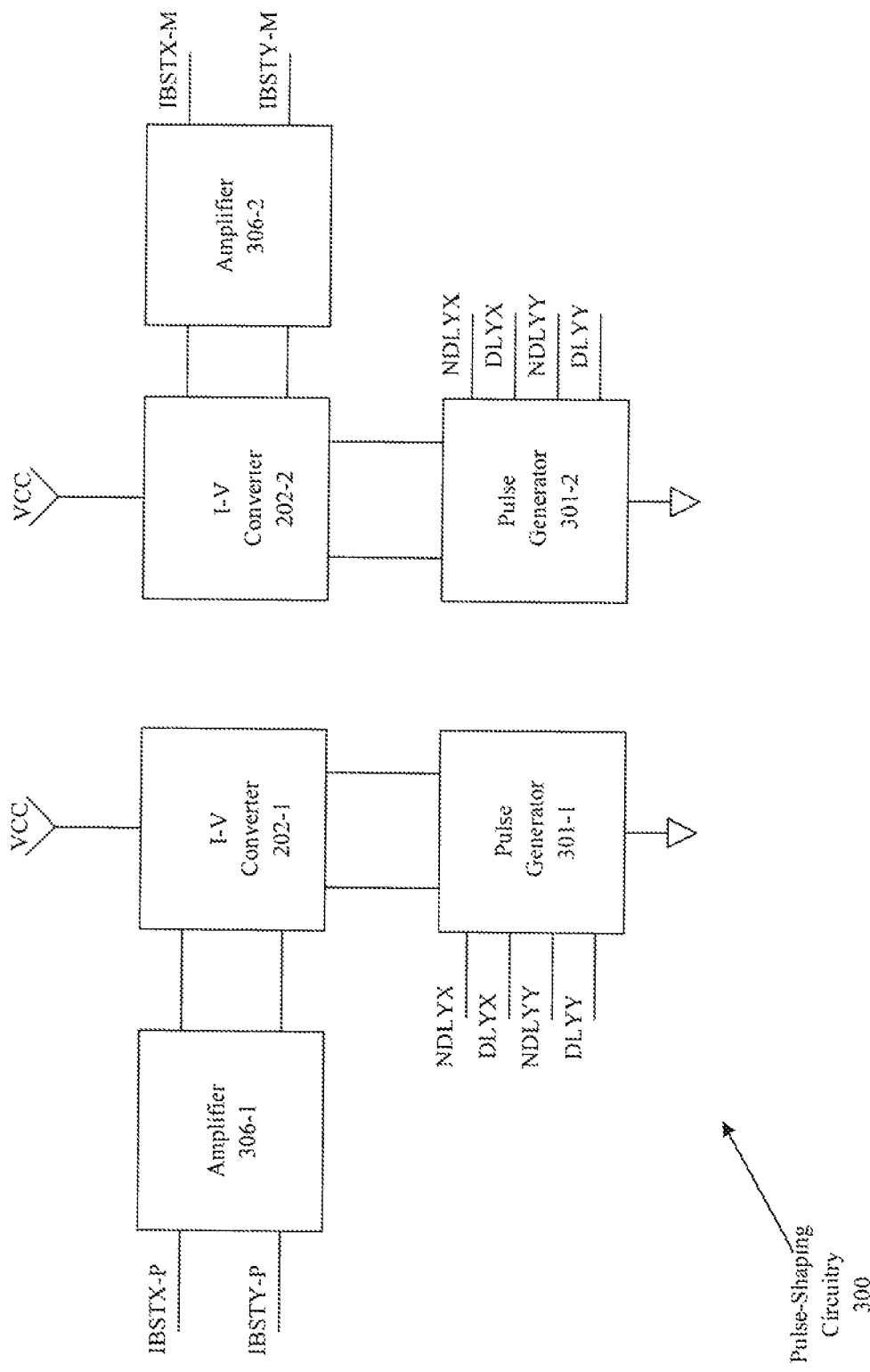
FIGS. 6-8B are diagrams of an example of pulse-shaping circuitry for the preamplifier of FIG. 1 in accordance with an embodiment of the present invention.

Turning to FIG. 6, pulse-shaping circuitry 300 in accordance with an embodiment of the present invention can be seen. As shown, pulse-shaping circuitry 300 has a similar construction to pulse-shaping circuitry 108, but pulse generators 201-1 and 201-2 and amplifiers 206-1 and 206-2 have been replaced with pulse generators 301-1 and 301-2 and amplifiers 306-1 and 306-2. The inclusion of pulse generators 301-1 and 301-2 and amplifiers 306-1 and 306-2 generally allow for a low supply voltage between an upper supply rail VCC (i.e., at about 5V) and a low supply rail (i.e., ground).

Figure 7A:
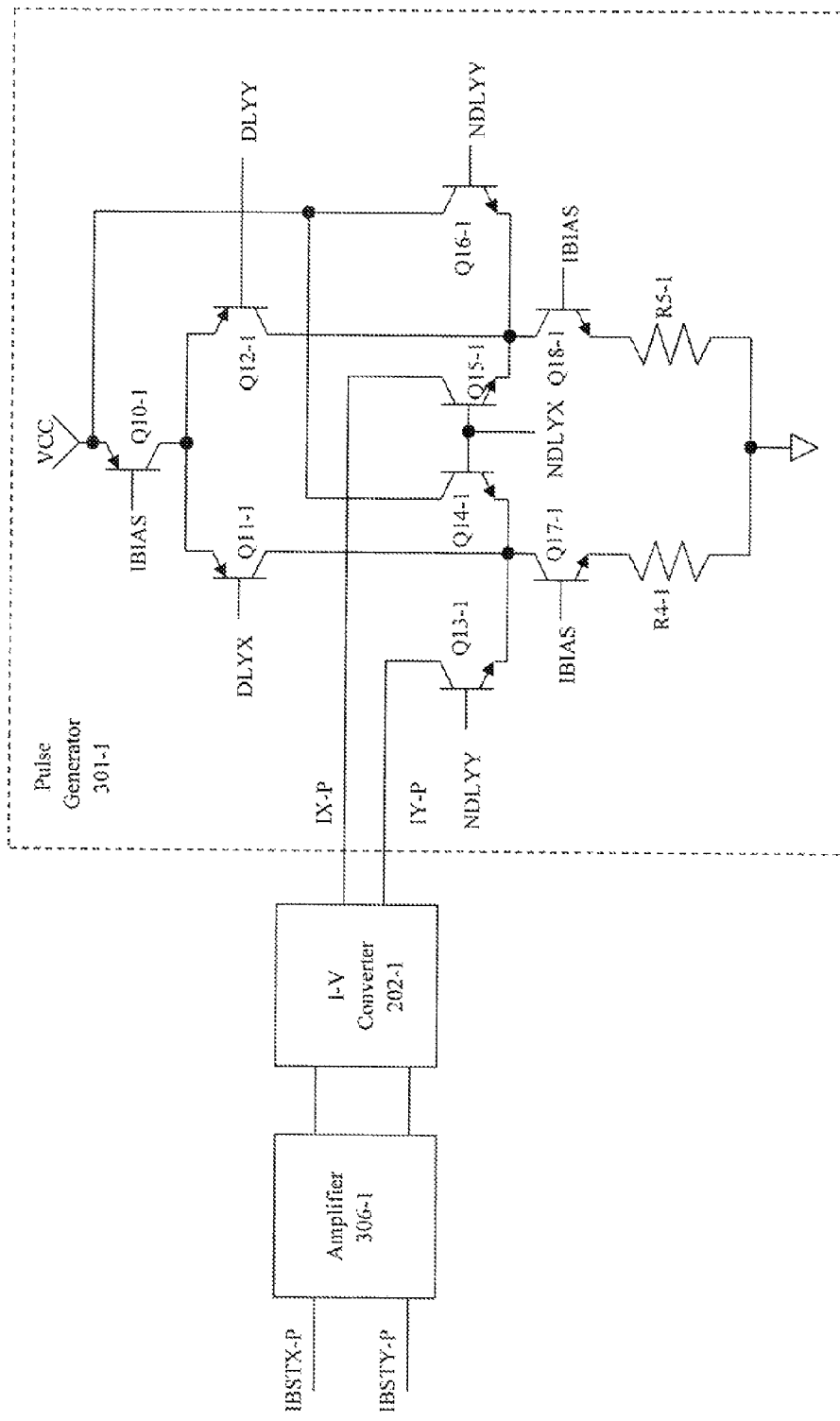
Figure 7B:
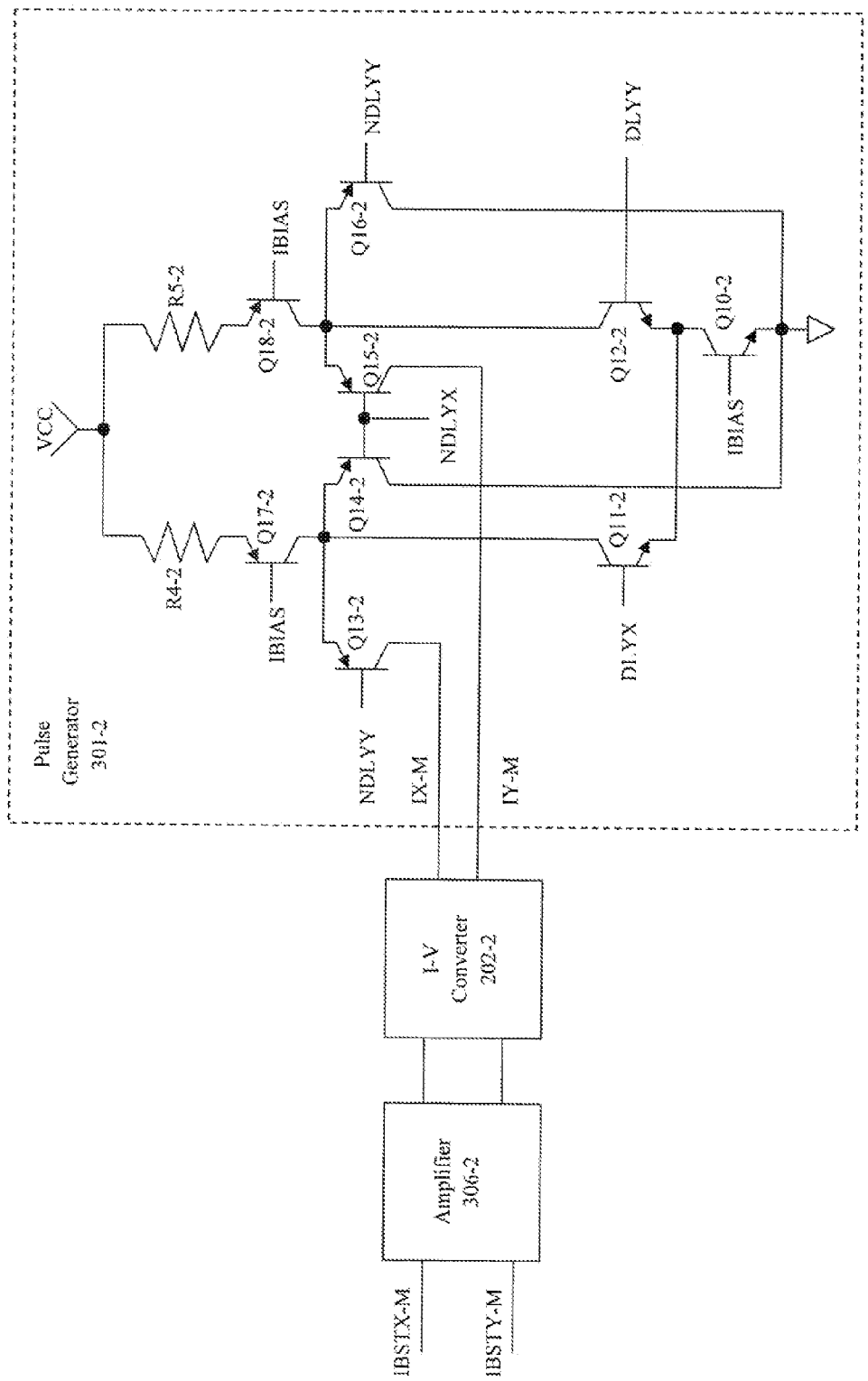

In FIGS. 7A and 7B, the pulse generators 301-1 and 301-2 can be seen in greater detail. As shown, pulse generators 301-1 and 301-2 each have two differential pairs (i.e., transistors Q13-1 to Q16-1 and transistors Q13-2 to Q16-2) that receive write data input signals NDLYY and NDLYX (which forms a differential write data input signal) and that are cascaded with bias transistors Q17-1/Q18-1 and Q17-2/Q18-2, which are coupled to a supply or voltage rail (i.e., VCC or ground) through resistors R4-1/R5-1 and R4-2/R5-2. Transistors Q13-1/Q15-1 and Q13-2/Q15-2 are then coupled to provide currents IX-P/IY-P and IX-M/IY-M to I-V converters 202-1 and 202-2, respectively. Another differential pair (i.e., transistors Q11-1/Q12-1 and Q11-2/Q12-2) that receives signals DLYY and DLYX (which forms a delayed differential write data input signal) is coupled to the bias transistor Q17-1/Q18-1 and Q17-2/Q18-2 within each pulse generator 301-1 and 301-2. Since the transistors Q11-1/Q12-1 and Q11-2/Q12-2 are outside of the signal or current paths that provides currents IX-P/IY-P and IX-M/IY-M, there is an approximate voltage drop of $2V_{CE}$, instead of $3V_{CE}$. This would mean there would be a voltage headroom of about 2V.

Figure 8A:
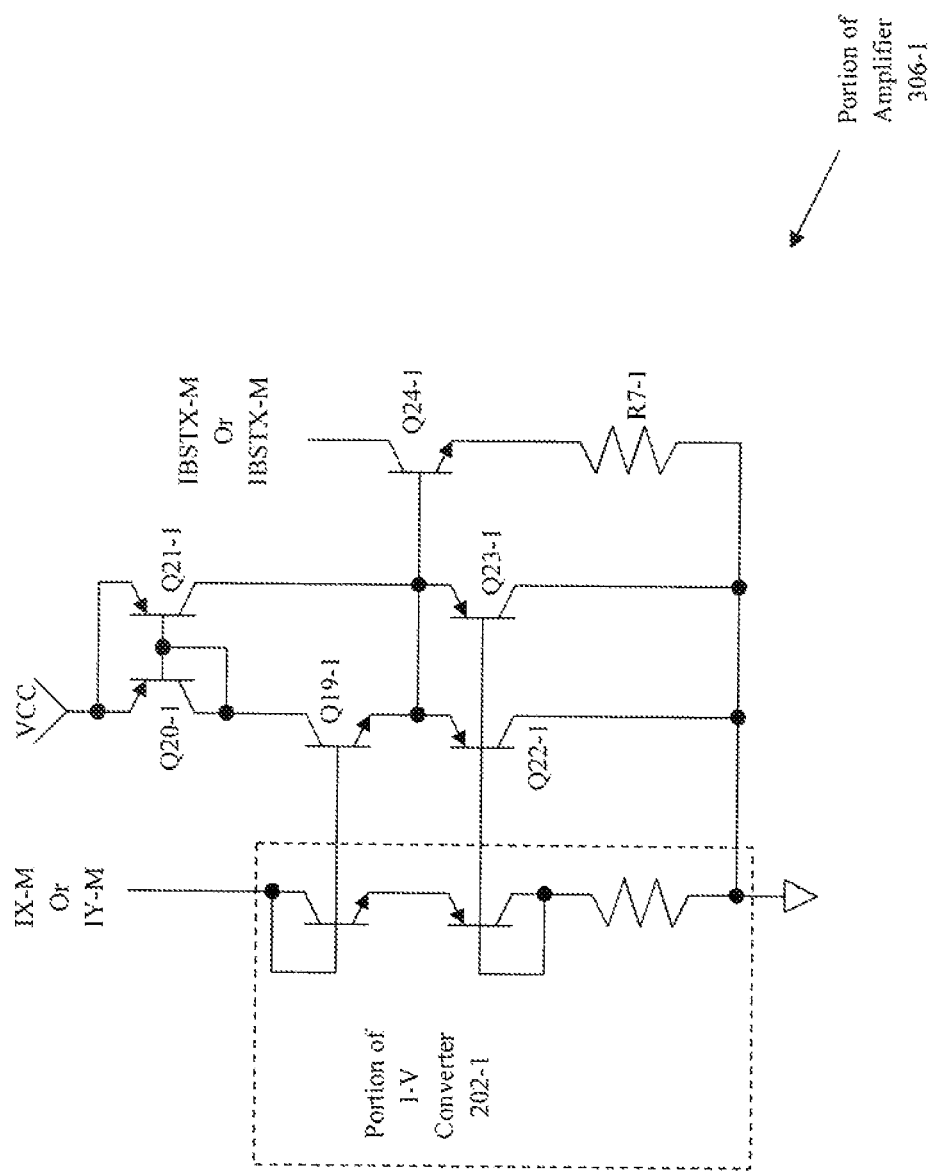
Figure 8B:
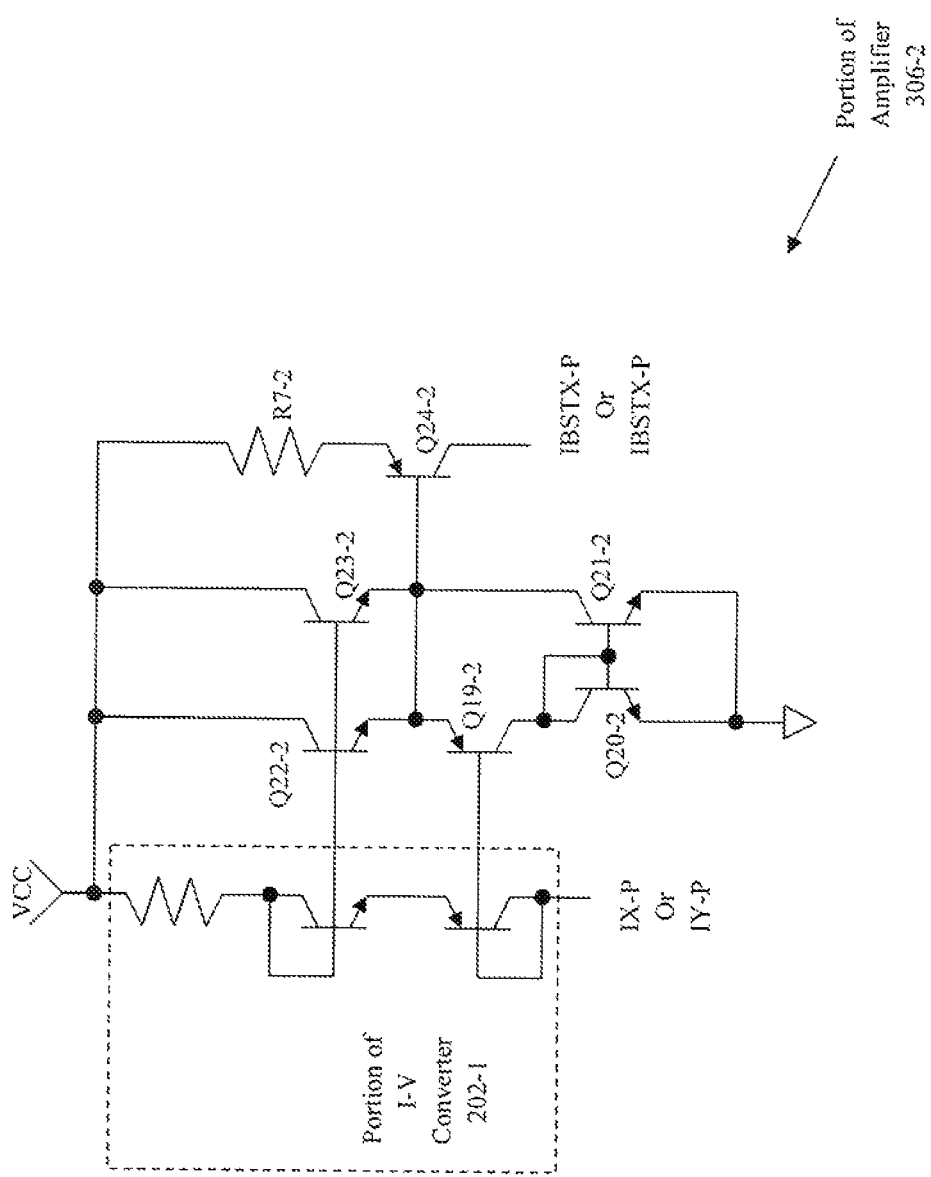

Turning to FIGS. 8A and 8B, portions of the amplifiers 306-1 and 306-2 can be seen in greater detail. As with pulse-shaping circuitry 108, pulse shaping circuitry 300 uses "diode stacks" within the I-V converters 202-1 and 202-2 to convert currents IX-P/IY-P and IX-M/IY-M to voltages. Also, similar to amplifiers 206-1 and 206-2, amplifiers 306-1 and 306-2 each use a two stages class AB amplifier, where the first stage includes a push-pull amplifier (i.e., transistors Q19-1/Q22-1 and Q19-2/Q22-2). A difference between the first stage of amplifiers 306-1 and 306-2 and amplifiers 206-1 and 206-2 is that transistors Q19-1/Q22-1 and Q19-2/Q22-2 are scaled to generate maintain the same current that is applied to the "diode stacks" (i.e., currents IX-P/IY-P and IX-M/IY-M). This first stage of amplifiers 306-1 and 306-2 also includes an intermediate stage that has a current minor (i.e., transistors Q20-1/Q21-1 and Q20-2/Q21-2) and transistor Q23-1 and Q23-2, which provides an additional current that is scaled by the amount ($\alpha$−1), resulting in a total increase in current from 1 to $\alpha$ across the first stage. By using this intermediate stage, there is no voltage drop across transistors Q22-1 and Q22-2, meaning that the voltage drop (due to the "diode stack") would $2V_{CE}$. Thus the total voltage headroom should be about 5V so as to generally provide significant power savings in the H-Bridge 110. Additionally, use of this intermediate stage reduces input node parasitic capacitance (node capacitance comprises of device capacitance of only 2 devices in 306-1 & 306-2 as compared to (1+$\alpha$) times the device capacitance in 202-1 & 202-2), which helps increase the speed. The second stage of amplifiers 306-1 and 306-2 is also similar to amplifiers 206-1 and 206-2 in that this output stage is generally a common emitter amplifier (i.e., transistor Q24-1/resistor R7-1 and would also transistor Q24-2/resistor R7-2) that increases the current from $\alpha$ to ($\alpha*\beta$) to generate amplified boost current signals IBSTX-P/IBSTY-P and IBSTX-M/IBSTY-M. Thus, pulse-shaping circuitry 300 is able to supply similar waveforms to pulse-shaping circuitry 108, but it uses a lower supply voltage (which can impact the entire signal chain by reducing requirements) while maintaining or even improving the high-speed performance.

Figure 9:
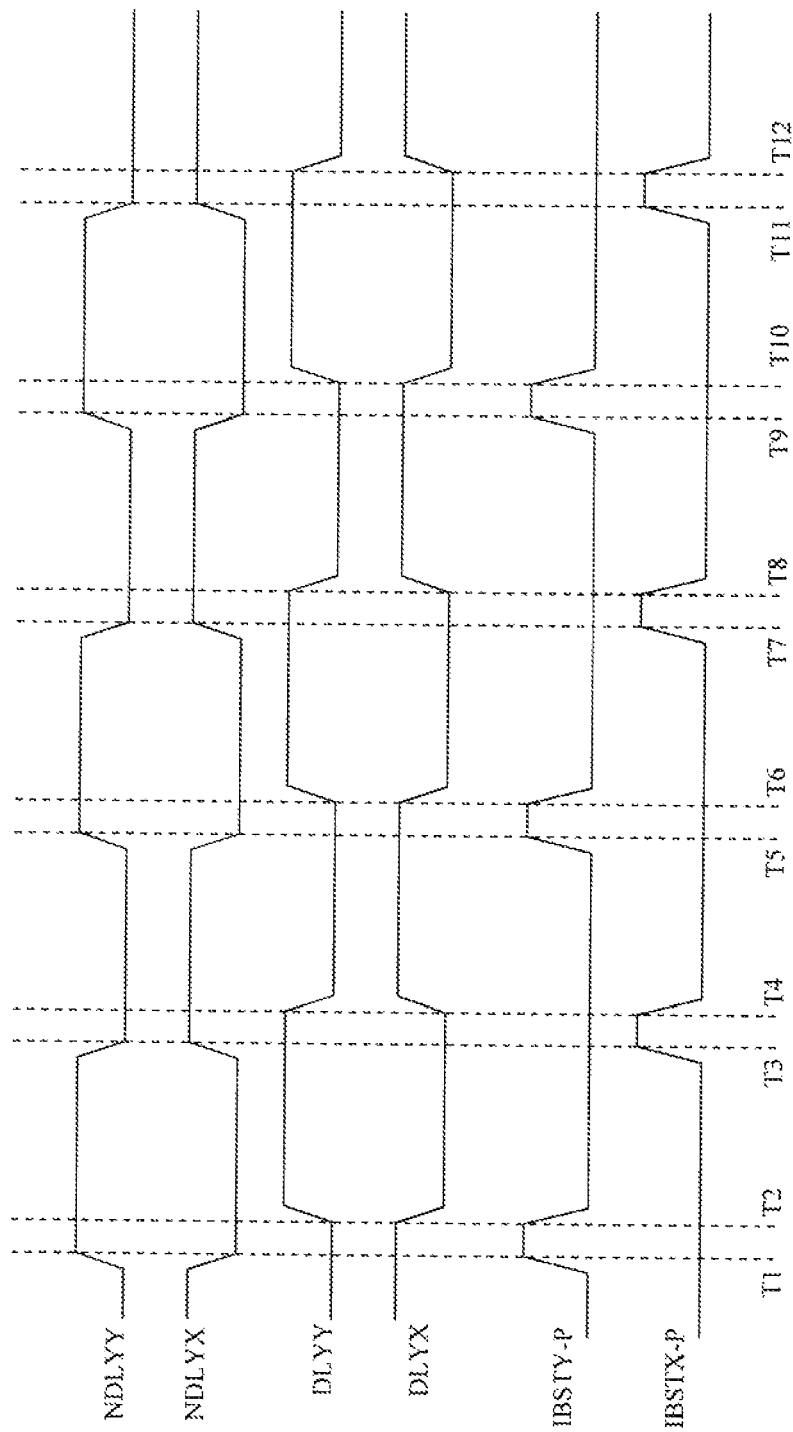
FIG. 9 is a diagram showing an operation of the pulse shaping circuitry of FIGS. 6-8B.

As an example, in FIG. 9, the function of the pulse-shaping circuitry 300 can be seen. In this example, the signals IBSTX-P and IBSTY-P are generated. Between time T1 and T2, signals NDLYY and DLYX are logic high or "1," meaning that transistor Q13-1 is "on," while transistor Q11-1 is "off." As the signal DLYX transitions to logic low or "0" after time T2, transistor Q11-1 turns "on" so as to generate a current pulse (i.e., pulse in signal IY-P) between times T1 and T2 (which is converted to the pulse in signal IBSTY-P on the rising edge of the differential write data input signal). This pulse in IBSTY-P is then repeated between times T5 and T6 and between time T9 and T10. For the interval between times T3 and T4, times T7 and T8, and T11 and T12, signals NDLYX and DLYX are logic high or "1," meaning that transistor Q15-1 is "on," while transistor Q12-1 is "off," and, as signal DLYX transitions to logic low or "0," transistor Q12-1 is turned "on" after times T4, T8, and T12, generating pulses for signal IBSTX-P on the falling edge of the differential write data input signal.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a pulse generator having:

a first differential pair of transistors that receives a first differential input signal and that outputs a first current signal;
a first bias transistor that is coupled to each transistor from the first differential pair at a first node;
a second differential pair of transistors that receives the first differential input signal and that outputs a second current signal;
a second bias transistor that is coupled to each transistor from the second differential pair at a second node;
a third differential pair of transistors that receives a second differential input signal, wherein a first transistor from the third differential pair is coupled to the first node, and wherein a second transistor from the third differential pair is coupled to the second node;
a current-to-voltage (I-V) converter that is coupled to each of the first and second differential pairs so as to receive the first and second current signals; and
an amplifier that is coupled to the I-V converter that generates a first output signal in response to the first current signal and a second output signal in response to the second current signal.

2. The apparatus of claim 1, wherein the first differential input signal further comprises a write data input signal, and wherein the second differential input signal further comprises a delayed write data input signal.

3. The apparatus of claim 2, wherein the first current signal further comprises a first current pulse in response to a first edge of the write data input signal, and wherein the second current signal further comprises a second current pulse in response to a second edge of the write data input signal.

4. The apparatus of claim 3, wherein the first edge further comprises a rising edge, and wherein the second edge further comprises a falling edge.

5. The apparatus of claim 4, wherein the I-V converter further comprises a first portion and a second portion, and wherein each of the first and second portions of the I-V converter further comprises:
a first diode that is coupled to the pulse generator;
a second diode that is coupled to the first diode; and
a resistor that is coupled to the second diode.

6. The apparatus of claim 5, wherein the amplifier further comprises a first portion that is coupled to the first portion of the I-V converter and a second portion that is coupled to the second portion of the I-V converter, and wherein each of the first and second portions of the amplifier further comprise:
a push-pull amplifier coupled across its first and second diodes;
a intermediate stage that is coupled to the push-pull amplifier, wherein the intermediate stage includes a current minor; and
a common emitter amplifier that is coupled to the current mirror of the intermediate stage.

7. The apparatus of claim 6, wherein the push pull amplifier further comprises:
a first bipolar transistor that is coupled to the first diode at its base; and
a second bipolar transistor that is coupled to the second diode at its base and the emitter of the first bipolar transistor at its emitter.

8. The apparatus of claim 7, wherein the intermediate stage further comprises:
a third bipolar transistor that is coupled to collector of the first bipolar transistor at its collector and base;
a fourth bipolar transistor that is coupled to the base of the third bipolar transistor; and a fifth bipolar transistor that is coupled to the emitter of the first bipolar transistor at its emitter and the second diode at its base.

9. An apparatus comprising:
a signal buffer that is configured to provide write data input signal and a delayed write data input signal;
pulse-shaping circuitry having:
first and second pulse generators that each include:
a first differential pair of transistors that receives the write data input signal and that outputs a first current signal;
a first bias transistor that is coupled to each transistor from the first differential pair at a first node;
a second differential pair of transistors that receives the write data input signal and that outputs a second current signal;
a second bias transistor that is coupled to each transistor from the second differential pair at a second node;
a third differential pair of transistors that receives the delayed write data input signal, wherein a first transistor from the third differential pair is coupled to the first node, and wherein a second transistor from the third differential pair is coupled to the second node;
first and second I-V converters, wherein the first I-V converter is coupled to each of the first and second differential pairs from the first pulse generator, and wherein the second I-V converter is coupled to each of the first and second differential pairs from the second pulse generator; and
first and second amplifiers, wherein the first amplifier is coupled to the first I-V converter, and wherein the second amplifier is coupled to the second I-V converter; and an H-bridge that is coupled to the each of the first and second amplifiers.

10. The apparatus of claim 9, wherein the first current signal further comprises a first current pulse in response to a first edge of the write data input signal, and wherein the second current signal further comprises a second current pulse in response to a second edge of the write data input signal.

11. The apparatus of claim 10, wherein the first edge further comprises a rising edge, and wherein the second edge further comprises a falling edge.

12. The apparatus of claim 11, wherein each of the first and second I-V converters further comprises a first portion and a second portion, and wherein each of the first and second portions of the I-V converters further comprises:
a first diode that is coupled to the pulse generator;
a second diode that is coupled to the first diode; and
a resistor that is coupled to the second diode.

13. The apparatus of claim 12, wherein each of the first and second amplifiers further comprises a first portion that is coupled to the first portion of its I-V converter and a second portion that is coupled to the second portion its I-V converter, and wherein each of the first and second portions of the amplifier further comprise:
a push-pull amplifier coupled across its first and second diodes;
a intermediate stage that is coupled to the push-pull amplifier, wherein the intermediate stage includes a current minor; and
a common emitter amplifier that is coupled to the current mirror of the intermediate stage.

14. The apparatus of claim 13, wherein the apparatus further comprises:

an input buffer that is configured to receive a write signal from a channel; and a duration generator that is coupled between input buffer and the pulse-shaping circuitry.

15. The apparatus of claim 14, wherein the push pull amplifier and the intermediate stage further comprises:

a first bipolar transistor that is coupled to the first diode at its base; and a second bipolar transistor that is coupled to the second diode at its base and the emitter of the first bipolar transistor at its emitter;

a third bipolar transistor that is coupled to collector of the first bipolar transistor at its collector and base;

a fourth bipolar transistor that is coupled to the base of the third bipolar transistor; and a fifth bipolar transistor that is coupled to the emitter of the first bipolar transistor at its emitter and the second diode at its base.

16. A method comprising:

activating a first transistor from a first differential input pair within a pulse generator in response to a first edge from a first portion of the differential input signal while a second transistor from a second differential input pair within the pulse generator is inactive, wherein the first transistor is biased by a first bias transistor that is coupled to a first supply rail;

activating the second transistor from the second differential input pair within the pulse generator in response to a second edge from a first portion of the delayed differential input signal;

outputting a first current pulse from the first transistor during the interval between the first edge and the second edge;

activating a third transistor from a third differential input pair within a pulse generator in response to a third edge from a second portion of the differential input signal while a fourth transistor from the second differential input pair within the pulse generator is inactive, wherein the third transistor is biased by a second bias transistor that is coupled to the first supply rail;

activating the fourth transistor from the second differential input pair within the pulse generator in response to a fourth edge from a second portion of the delayed differential input signal;

outputting a second current pulse from the third transistor during the interval between the third edge and the fourth edge;

converting the first and second current pulses into first and second voltage signals; and generating first and second output current signals from the first and second voltages.

17. The method of claim 16, wherein the first and second portions of the differential input signal further comprise positive and negative portions of the differential input signal, respectively, and wherein the corresponding first and second portions of the delayed differential input signal further comprise negative and positive portions of the delayed differential input signal, respectively.

18. The method of claim 17, wherein the step of amplifying further comprises:

applying the first and second voltage signals to first and second push-pull amplifiers, respectively;

scaling output currents from each of the first and second push-pull amplifiers up; and generating first and second output current signals.

19. The method of claim 18, wherein the method further comprises applying the first and second output currents to an H-bridge.

20. The method of claim 19, wherein the differential input signal and the delayed differential input signal further comprise a write data input signal and a delayed write data input signal, respectively.

* * * * *